United States Patent
Chen et al.

(10) Patent No.: US 8,054,101 B2
(45) Date of Patent: Nov. 8, 2011

(54) CURRENT SOURCE APPLICABLE TO A CONTROLLABLE DELAY LINE AND DESIGN METHOD THEREOF

(75) Inventors: Chi-Che Chen, Taipei County (TW); Jung-Chi Ho, Taipei County (TW)

(73) Assignee: Faraday Technology Corp., Science-Based Industrial Park, Hsin-Chu (TW)

( * ) Notice: Subject to any disclaimer, the term of this patent is extended or adjusted under 35 U.S.C. 154(b) by 43 days.

(21) Appl. No.: 12/436,988

(22) Filed: May 7, 2009

(65) Prior Publication Data
US 2010/0283507 A1 Nov. 11, 2010

(51) Int. Cl.
*H03K 19/0175* (2006.01)
(52) U.S. Cl. ........... 326/83; 326/82; 326/86; 326/87; 327/158; 327/276; 341/143; 341/155
(58) Field of Classification Search ............ 326/81–83, 326/86–87; 327/158, 161, 153, 237, 235, 327/538, 540, 271, 274, 277, 280–287; 341/144, 341/118, 100, 153–154, 145, 136; 330/127, 330/252–254
See application file for complete search history.

(56) References Cited

U.S. PATENT DOCUMENTS

| | | | |
|---|---|---|---|
| 4,016,511 A | 4/1977 | Ramsey et al. | |
| 6,531,974 B1* | 3/2003 | Callahan et al. | 341/144 |
| 6,674,314 B2* | 1/2004 | Takai | 327/158 |
| 6,914,467 B2* | 7/2005 | Feng et al. | 327/261 |
| 6,992,534 B2* | 1/2006 | Lin | 331/176 |
| 7,298,173 B1* | 11/2007 | Jiang et al. | 326/83 |
| 7,564,285 B2* | 7/2009 | Chang et al. | 327/276 |
| 7,652,604 B2* | 1/2010 | Parayandeh et al. | 341/143 |
| 7,664,216 B2* | 2/2010 | Schnarr | 375/376 |
| 2007/0069780 A1* | 3/2007 | Kim | 327/158 |
| 2007/0236269 A1* | 10/2007 | Viswanathan | 327/276 |

OTHER PUBLICATIONS

Authored by Maymandi-Nejad, et al., article titled "A Monotonic Digitally Controlled Delay Element," adopted from IEEE Journal of Solid-State Circuits, vol. 40, No. 11, Nov. 2005, pp. 2212-2219.
Authored by Maymandi-Nejad, et al., article titled "A Digitally Programmable Delay Element: Design and Analysis," adopted from IEEE Transactions on Very Large Scale Integration (VLSI) Systems, vol. 11, No. 5, Oct. 2003, pp. 871-878.

* cited by examiner

*Primary Examiner* — Shawki S Ismail
*Assistant Examiner* — Christopher Lo
(74) *Attorney, Agent, or Firm* — Winston Hsu; Scott Margo

(57) ABSTRACT

A current source and a method for designing the current source are provided. The current source is designed by a recursive rule and enables controllable delay lines to provide linear delay and occupy smaller area than conventional controllable delay lines with thermometer code current sources do.

11 Claims, 10 Drawing Sheets

| Input code | | | Current branch | | | | | | | |
|---|---|---|---|---|---|---|---|---|---|---|
| D2 | D1 | D0 | MS0 | MS1 | MS2 | MS3 | MS4 | MS5 | MS6 | MS7 |
| 1 | 1 | 1 | ◎ | | | | | | | |
| 1 | 1 | 0 | ◎ | ◎ | | | | | | |
| 1 | 0 | 1 | ◎ | | ◎ | | | | | |
| 1 | 0 | 0 | ◎ | ◎ | ◎ | | | | | |
| 0 | 1 | 1 | ◎ | | | | ◎ | | | |
| 0 | 1 | 0 | ◎ | ◎ | | ◎ | | | | |
| 0 | 0 | 1 | ◎ | | ◎ | ◎ | | ◎ | | |
| 0 | 0 | 0 | ◎ | ◎ | ◎ | ◎ | ◎ | ◎ | ◎ | ◎ |

FIG. 14

CURRENT SOURCE APPLICABLE TO A CONTROLLABLE DELAY LINE AND DESIGN METHOD THEREOF

BACKGROUND OF THE INVENTION

1. Field of the Invention

The present invention relates to a current source applicable to a controllable delay line and a method for designing the current source.

2. Description of the Related Art

FIG. 1 is a schematic diagram showing a conventional controllable delay line 100. six p-channel metal oxide semiconductor field effect transistors (PMOSFETs) $M_1$-$M_6$ constitute six current branches of the current source 110 of the controllable delay line 100. The input signals a, b, c, d, and e constitute the digital input vector of the current source 110. The digital input vector controls the on/off condition of the PMOSFETs $M_1$-$M_5$, which controls the total output current of the current source 110. The output current of the current source 110 determines the delay of the controllable delay line 100.

The controllable delay line 100 has a small area due to its analog design. As shown in FIG. 2, the delay of the controllable delay line 100 is monotonic in response to different values of the digital input vector abcde. However, due to its binary code control mechanism, the delay of the controllable delay line 100, either derived from empirical equation or obtained from measurement, is non-linear. This non-linearity has an adverse effect on the resolution of the controllable delay line 100.

FIG. 3 is a schematic diagram showing a conventional current-starved controllable delay line 300. The output current of the current source 320 of the controllable delay line 300 is controlled by a thermometer code D0-D6 instead of a binary code. Therefore, a binary-to-thermometer conversion circuit 310 is required to convert the 3-bit binary input code B0-B2 to the 7-bit thermometer code D0-D6. FIG. 4 is a schematic diagram showing the circuit of the current source 320. PMOSFETs MS0-MS7 are always turned on. MS0-MS7 represent the eight current branches of the current source 320. The current branch including the PMOSFET MS0 is always turned on. Each of the other seven current branches of the current source 320 is turned on or turned off in response to one bit of the thermometer code D0-D6.

The delay of the controllable delay line 300 is linear because of its thermometer code control mechanism. The linearity is desirable. However, a current source controlled by thermometer code occupies more area than a current source controlled by binary code does because the current source controlled by thermometer code needs an additional binary-to-thermometer conversion circuit.

FIG. 5 is a schematic diagram showing a conventional programmable digital delay line 500. The digital delay line 500 consists of many stages, such as the stages 510 and 520. Each stage includes a delay unit and a multiplexer. For example, the stage 510 includes the delay unit 511 and the multiplexer 512. The delay unit 511 of the first stage 510 includes two serially connected inverters for delaying the input signal. The delay unit 521 of the second stage 520 includes four serially connected inverters for delaying the input signal, and so on. Finally, the delay unit of the last stage includes $2^{N+1}$ serially connected inverters for delaying the input signal. The input code C0-CN determines the transmission path of the input signal through the stages, thus controlling the delay of the digital delay line 500.

The digital delay line 500 features linear delay and simple design. However, such a digital delay line imposes very large area overhead due to the amount of inverters and multiplexers required.

SUMMARY OF THE INVENTION

Accordingly, the present invention is directed to a current source and a method for designing the current source. The current source enables controllable delay lines to provide linear delay and occupy smaller area than conventional controllable delay lines with thermometer code current sources do.

According to an embodiment of the present invention, an N-bit current source is provided. The output current of the N-bit current source is controlled by an N-bit input code, wherein N is a predetermined positive integer. When N is equal to one, the N-bit current source includes a first current branch and a second current branch. The second current branch is coupled in parallel with the first current branch between a voltage terminal and an output terminal. When N is greater than one, the N-bit current source includes two (N−1)-bit current sources and a switch device. The output currents of the two (N−1)-bit current sources are controlled by the N−1 least significant bits (LSBs) of the input code. The two (N−1)-bit current sources are coupled in parallel between the voltage terminal and the output terminal. The switch device is coupled in series with each of the current branches of the second (N−1)-bit current source between the voltage terminal and the output terminal.

In this embodiment of the present invention, the first current branch of the N-bit current source is always turned on. The second current branch of the 1-bit current source is turned on or turned off according to the 1-bit input code. The switch device is turned on or turned off according to the most significant bit (MSB) of the input code.

In this embodiment of the present invention, the switch device may include two expansion switches. The first expansion switch is coupled in series with the first current branch of the second (N−1)-bit current source between the voltage terminal and the output terminal. The second expansion switch is coupled in series with the other current branches of the second (N−1)-bit current source between the voltage terminal and the output terminal. The first and the second expansion switches are turned on or turned off according to the MSB of the input code.

According to another embodiment of the present invention, another N-bit current source is provided. The output current of the N-bit current source is controlled by an N-bit input code, wherein N is a predetermined positive integer. When N is equal to one, the N-bit current source includes two current branches coupled in parallel between a voltage terminal and an output terminal. When N is greater than one, the N-bit current source includes two (N−1)-bit current sources and an expansion switch. The output current of the two (N−1)-bit current sources are controlled by the N−1 LSBs of the input code. The two (N−1)-bit current sources are coupled in parallel between the voltage terminal and the output terminal. The expansion switch is coupled in series with all the current branches of the second (N−1)-bit current source except the first current branch of the second (N−1)-bit current source between the voltage terminal and the output terminal.

In this embodiment of the present invention, the first current branch of the 1-bit current source is always turned on. The first current branch of the second (N−1)-bit current source and the expansion switches are turned on or turned off according to the MSB of the input code.

According to another embodiment of the present invention, a method for designing a current source is provided, which includes the following steps. First, provide an N-bit current source whose output current is controlled by an N-bit input code, wherein N is a predetermined positive integer. The N-bit current source includes $2^N$ current branches coupled in parallel. Each of the current branches includes a branch current source. Next, determine the size of the first branch current source according to a predetermined output current corresponding to the value $2^N-1$ of the input code. For each value x of the input code that is less than or equal to $2^N-2$ and is greater than or equal to zero, determine the output current of the $(2^N-x)$-th branch current source by subtracting output currents of the other branch current sources turned on by the value x from a predetermined output current corresponding to the value x. Next, determine the size of the $(2^N-x)$-th branch current source according to the output current of the $(2^N-x)$-th branch current source.

In this embodiment of the present invention, the output current of the N-bit current source is provided to a controllable delay line and, before the step of providing the N-bit current source, the method further includes the following steps. First, determine N according to a delay range and a resolution of the controllable delay line. Next, determine the delay of the controllable delay line corresponding to each of the values of the input code according to the delay range and an intrinsic delay of the controllable delay line, wherein the delay of the controllable delay line is linear with respect to the values of the input code. Next, determine each of the predetermined output currents corresponding to each of the values of the input code according to the delay of the controllable delay line.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 14 is a table showing on/off conditions of the current branches of the current source in FIG. 10 corresponding to the values of its digital input code.

DESCRIPTION OF THE EMBODIMENTS

Figure 1:
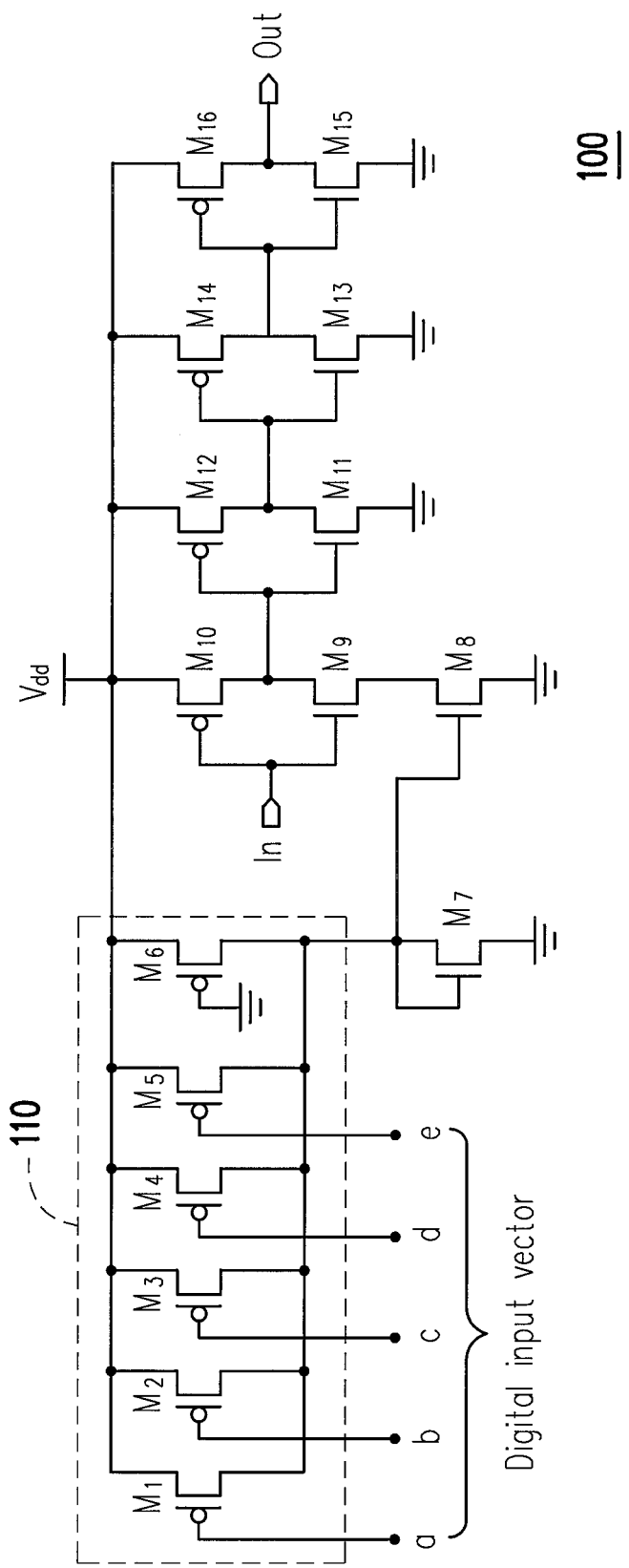
FIG. 1 is a schematic diagram showing a conventional controllable delay line.
Figure 2:
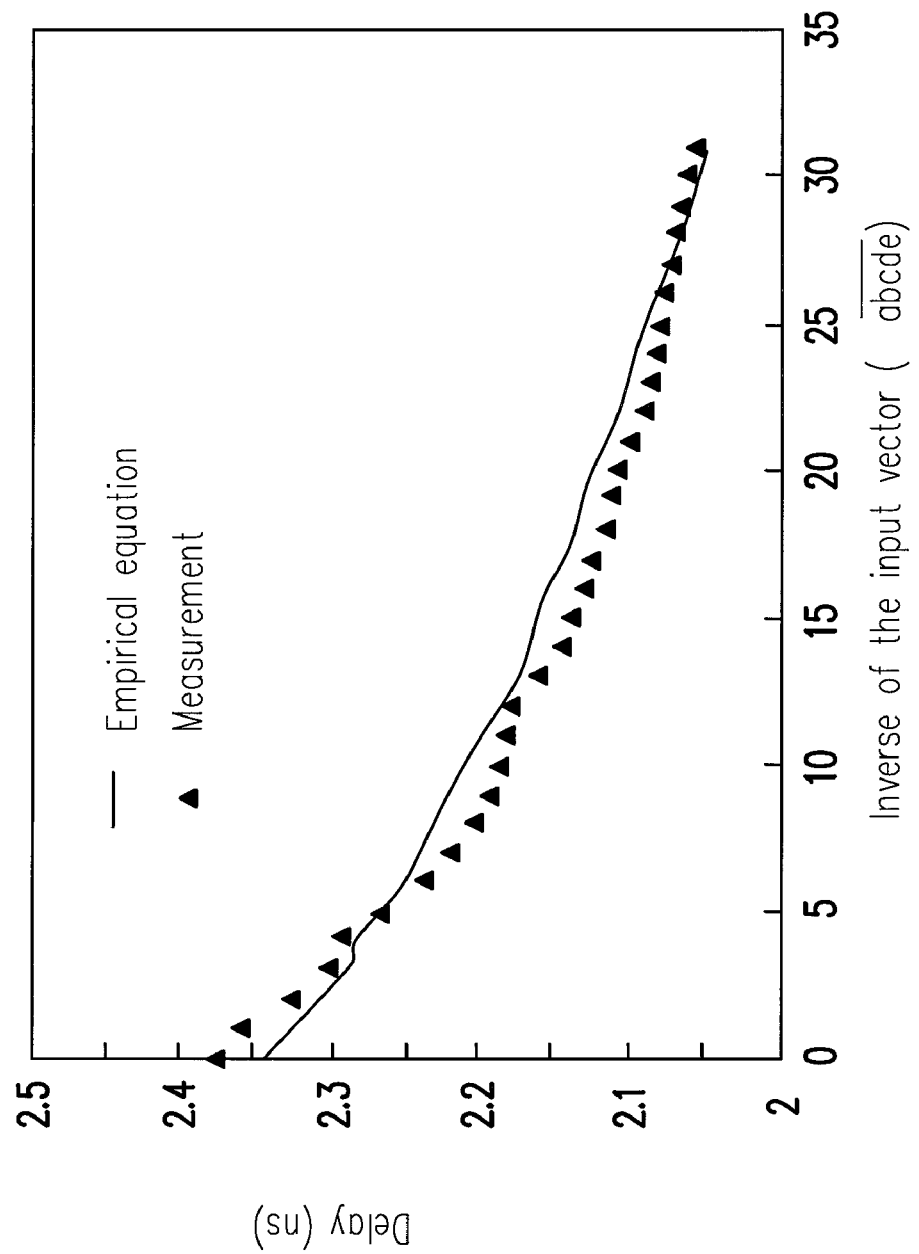
FIG. 2 is a schematic diagram showing the delay of the controllable delay line in FIG. 1 with respect to values of its input vector.
Figure 3:
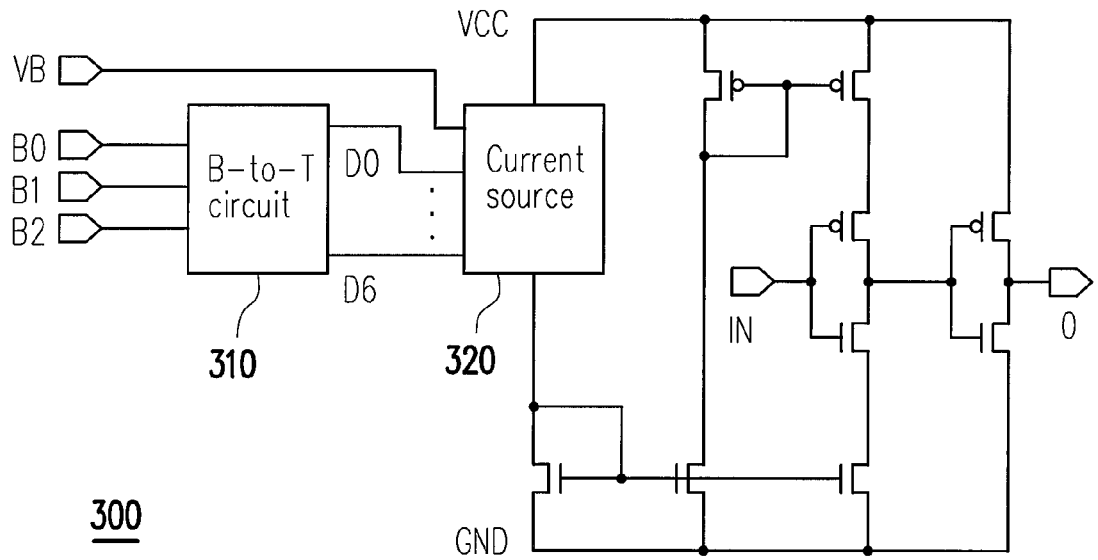
FIG. 3 is a schematic diagram showing a conventional current-starved controllable delay line.

Reference will now be made in detail to the present embodiments of the invention, examples of which are illustrated in the accompanying drawings. Wherever possible, the same reference numbers are used in the drawings and the description to refer to the same or like parts.

Figure 6:
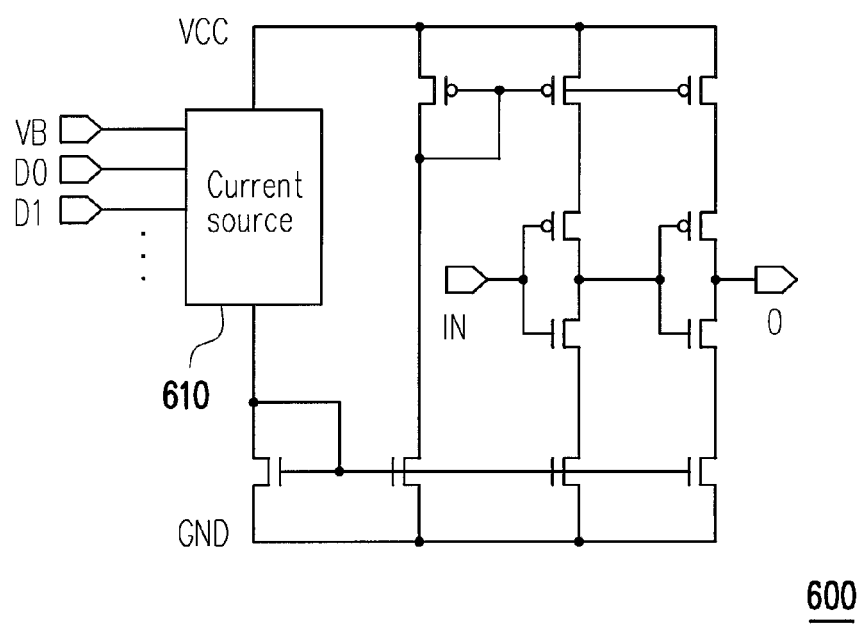
FIG. 6 is a schematic diagram showing a current-starved controllable delay line according to an embodiment of the present invention.
Figure 7:
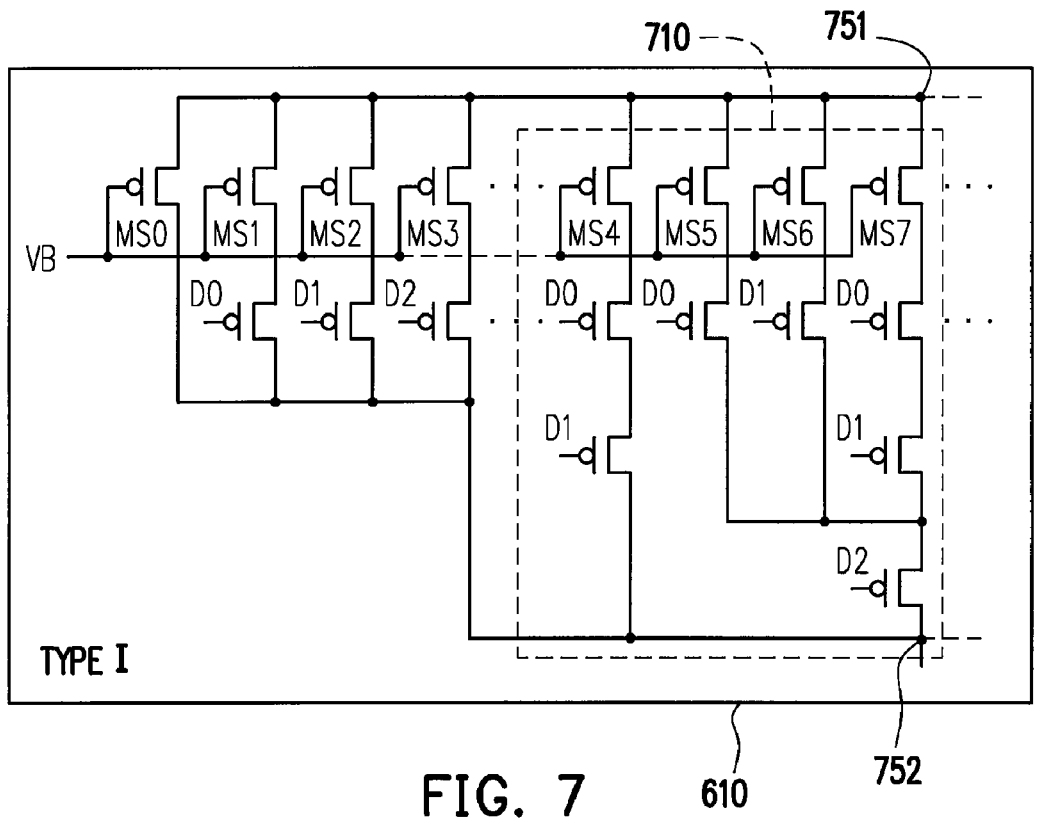
FIG. 7 is a schematic diagram showing an implementation of the current source of the controllable delay line in FIG. 6.
Figure 8:
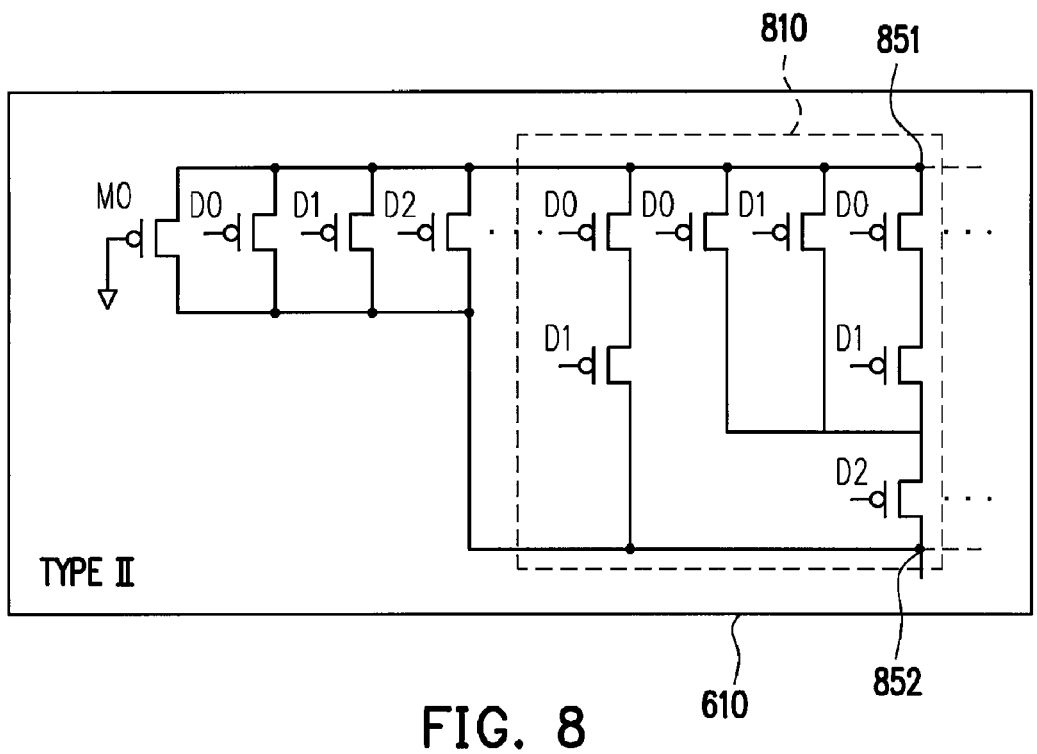
FIG. 8 is a schematic diagram showing another implementation of the current source of the controllable delay line in FIG. 6.

FIG. 6 is a schematic diagram showing a current-starved controllable delay line 600 including a current source 610 according to an embodiment of the present invention. FIG. 7 and FIG. 8 are schematic diagrams showing two alternative designs of the current source 610. The designs in FIG. 7 and FIG. 8 are called type I and type II, respectively. As early examples, the current sources in FIG. 7 and FIG. 8 are 3-bit current sources whose output currents are controlled by the 3-bit input code D0-D2. D2 is the MSB and D0 is the LSB. As discussed below, the designs in FIG. 7 and FIG. 8 may be easily modified to N-bit current sources, wherein N is an arbitrary positive integer.

FIG. 7 shows the current source 610 as a type I 3-bit current source. The part of the current source 610 outside the dashed line box 710 is a conventional current source controlled by binary input code. The part of the current source 610 inside the dashed line box 710 is the extra current branches added by this embodiment. In total, the 3-bit current source 610 includes $2^3$ current branches coupled in parallel between the voltage terminal 751 and the output terminal 752. The voltage terminal 751 is coupled to the predetermined voltage VCC in FIG. 6. The output terminal 752 is where the output current of the current source 610 is provided. The eight current branches are represented by the PMOSFETs MS0-MS7. The PMOSFETs MS0-MS7 are always turned on by the bias voltage VB to serve as current sources within each current branch. Therefore the PMOSFETs MS0-MS7 are also known as branch current sources.

The output currents of the branch current sources MS0-MS7 are determined by their individual sizes. The output currents of the branch current sources of the turned-on current branches accumulate at the output terminal 752 and the accumulated output currents are provided as the output current of the 3-bit current source 610. A current branch is considered as turned on when its switches are all turned on. For example, the current branch including MS0 is always turned on. The current branch including MS3 is turned on when D2 is equal to zero. The current branch including MS4 is turned on when both D0 and D1 are equal to zero. The current branch including MS7 is turned on when D0, D1 and D2 are all zero.

The output current of the 3-bit current source 610 is provided to the controllable delay line 600. The sizes of the branch current sources MS0-MS7 are predetermined so that the 3-bit current source 610 provides a predetermined output current in response to each possible value of the input code D0-D2. Due to the predetermined output currents, the delay of the controllable delay line 600 exhibits a predetermined linearity with respect to the values of the input code D0-D2, such as the linearity shown in FIG. 13. How to determine the sizes of the branch current sources according to the predetermined linearity will be discussed in details later.

FIG. 8 shows the current source 610 as a type II 3-bit current source. The part of the current source 610 outside the dashed line box 810 is a conventional current source controlled by binary input code. The part of the current source 610 inside the dashed line box 810 is the extra current branches added by this embodiment. The difference between the type I 3-bit current source 610 in FIG. 7 and the type. II 3-bit current source 610 in FIG. 8 is that the current source in FIG. 8 includes the switch M0 and does not include the PMOSFETs MS0-MS7. The topmost row of switches shown in FIG. 8 closest to the voltage terminal 851 serves as the branch current sources of each current branch. The branch current source M0 is always turned on. The other branch current sources are turned on and turned off according to the values of the input code D0-D2.

Regarding the choice between the type I current source in FIG. 7 and the type II current source in FIG. 8, the type I current source is more stable and more tolerant of process variations, while the type II current source is more suitable for low voltage applications.

Figures 9, 10:
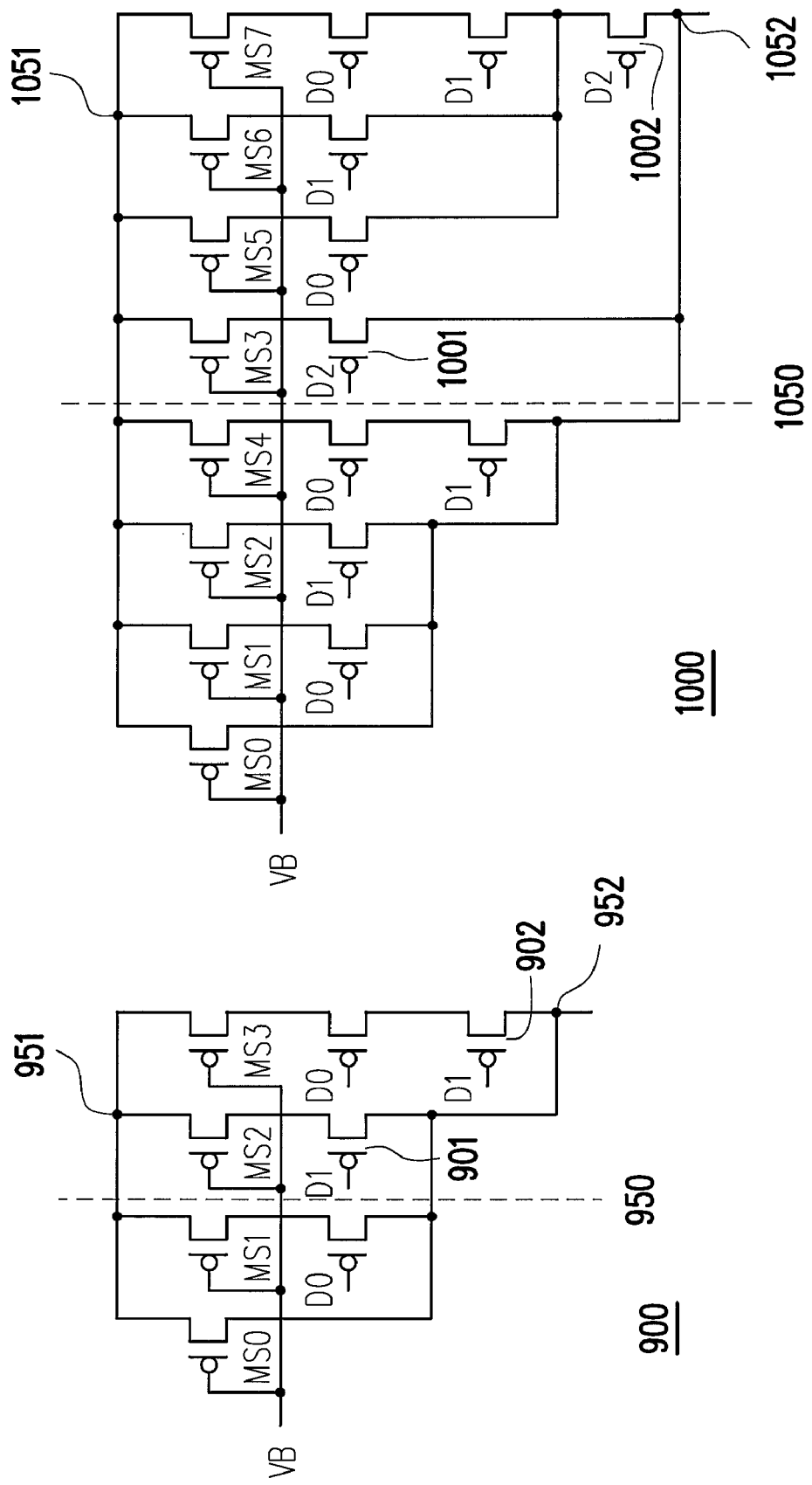
FIG. 9, FIG. 10, and FIG. 11 are schematic diagrams showing several current sources applicable to current-starved controllable delay lines according to embodiments of the present invention.
Figure 11:
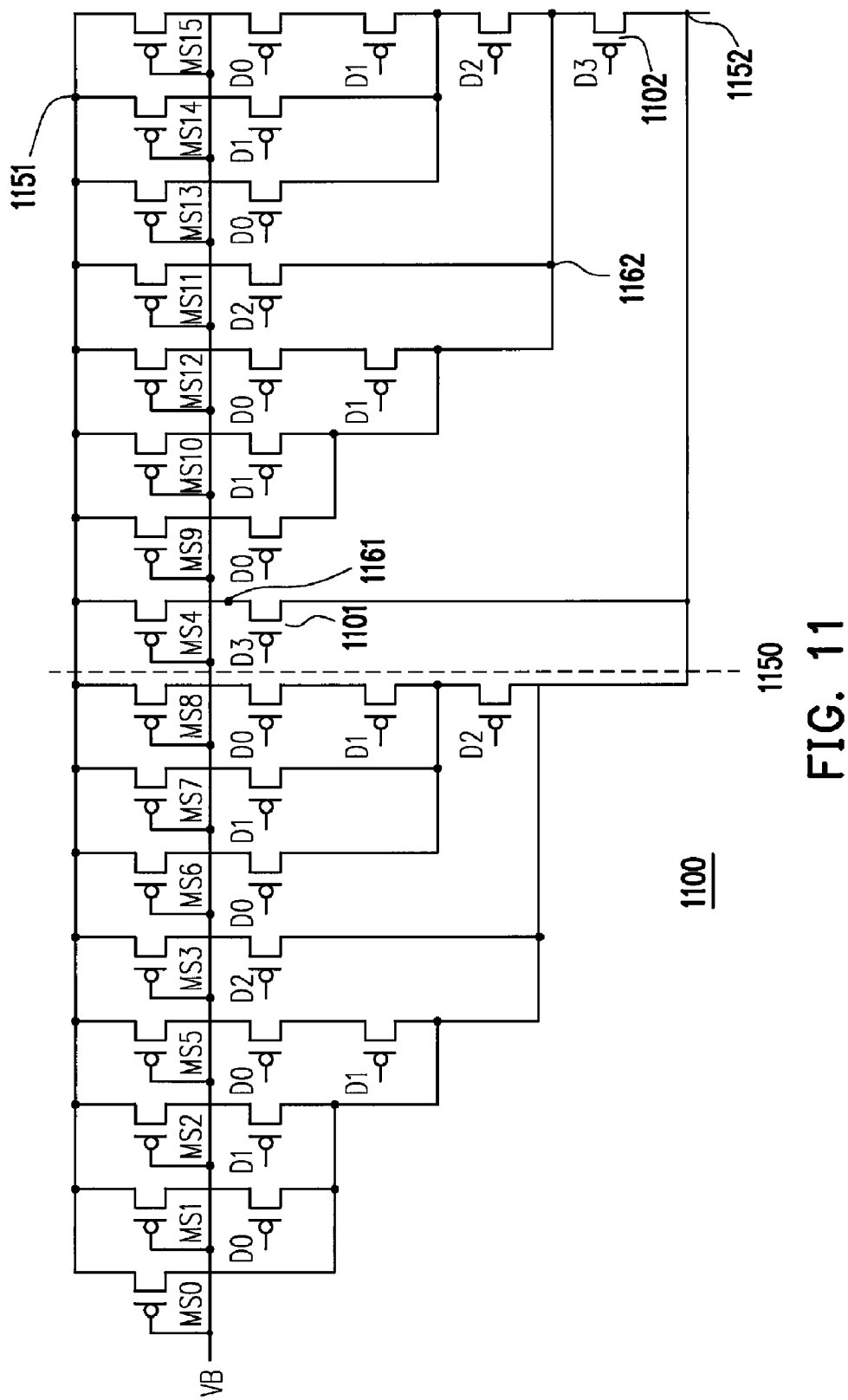

In general, the present invention provides an N-bit current source whose output current is controlled by an N-bit input code, wherein N is a predetermined positive integer. For example, FIG. 9 is a schematic diagram showing a 2-bit type I current source 900 according to an embodiment of the present invention. FIG. 10 is a schematic diagram showing a 3-bit type I current source 1000 according to another embodiment of the present invention. FIG. 11 is a schematic diagram showing a 4-bit type I current source 1100 according to another embodiment of the present invention.

The N-bit current source provided by the present invention has a recursive design. When N is equal to one, the 1-bit current source is the part of the 2-bit current source 900 on the left side of the dashed line 950. The 1-bit current source includes two current branches (the MS0 branch and the MS1 branch) coupled in parallel between the voltage terminal 951 and the output terminal 952. The MS0 current branch of the 1-bit current source is always turned on, while the MS1 current branch of the 1-bit current source is turned on or turned off according to the 1-bit input code D0.

When N is equal to 2, the 2-bit current source 900 in FIG. 9 includes two 1-bit current sources and two expansion switches. The first 1-bit current source (on the left side of the dashed line 950) and the second 1-bit current source (on the right side of the dashed line 950) are coupled in parallel between the voltage terminal 951 and the output terminal 952. The output current of each of the two 1-bit current sources is controlled by the LSB D0 of the 2-bit input code D0-D1. The first expansion switch 901 is coupled in series with the first current branch (the MS2 branch) of the second 1-bit current source between the voltage terminal 951 and the output terminal 952. The second expansion switch 902 is coupled in series with the other current branch (the MS3 branch) of the second 1-bit current source between the voltage terminal 951 and the output terminal 952. The first expansion switch 901 and the second expansion switch 902 are turned on or turned off according to the MSB D1 of the 2-bit input code D0-D1.

When N is equal to 3, the 3-bit current source 1000 in FIG. 10 includes two 2-bit current sources and two expansion switches. The first 2-bit current source (on the left side of the dashed line 1050) and the second 2-bit current source (on the right side of the dashed line 1050) are coupled in parallel between the voltage terminal 1051 and the output terminal 1052. The output current of each of the two 2-bit current sources is controlled by the two LSBs D0-D1 of the 3-bit input code D0-D2. The first expansion switch 1001 is coupled in series with the first current branch (the MS3 branch) of the second 2-bit current source between the voltage terminal 1051 and the output terminal 1052. The second expansion switch 1002 is coupled in series with the other three current branches (from the MS5 branch to the MS7 branch) of the second 2-bit current source between the voltage terminal 1051 and the output terminal 1052. The first expansion switch 1001 and the second expansion switch 1002 are turned on or turned off according to the MSB D2 of the 3-bit input code D0-D2.

When N is equal to 4, the 4-bit current source 1100 in FIG. 11 includes two 3-bit current sources and two expansion switches. The first 3-bit current source (on the left side of the dashed line 1150) and the second 3-bit current source (on the right side of the dashed line 1150) are coupled in parallel between the voltage terminal 1151 and the output terminal 1152. The output current of each of the two 3-bit current sources is controlled by the three LSBs D0-D2 of the 4-bit input code D0-D3. The first expansion switch 1101 is coupled in series with the first current branch (the MS4 branch) of the second 3-bit current source between the voltage terminal 1151 and the output terminal 1152. The second expansion switch 1102 is coupled in series with the other seven current branches (from the MS9 branch to the MS15 branch) of the second 3-bit current source between the voltage terminal 1151 and the output terminal 1152. The first expansion switch 1101 and the second expansion switch 1102 are turned on or turned off according to the MSB D3 of the 4-bit input code D0-D3.

A type I N-bit current source with N greater than 4 can be easily obtained by extending the recursive design rule shown in FIG. 9, FIG. 10, and FIG. 11.

The two expansion switches of a type I N-bit current source are equivalent to a switch device coupled in series with each of the current branches of the second type I (N−1)-bit current source of the type I N-bit current source between the voltage terminal and the output terminal. Obviously this equivalent switch device is turned on or turned off according to the MSB of the input code. In fact, the two expansion switches of a type I N-bit current source may be merged into a single expansion switch just like the aforementioned switch device. For example, the expansion switches 1101 and 1102 in FIG. 11 may be merged into a single expansion switch which is turned on or turned off according to the MSB D3 of the input code. In the case of a single expansion switch, the node 1161 and the node 1162 have to be connected to form a single node as well. The merging of the two expansion switches does not affect the operation and the performance of the type I N-bit current source.

A type II 1-bit current source can be obtained by removing the PMOSFET MS1 from the first 1-bit current source (the one on the left side of the dashed line 950) in FIG. 9. A type II 2-bit current source can be obtained by removing the PMOSFETs MS1-MS3 from the type I 2-bit current source 900. A type II 3-bit current source can be obtained by removing the PMOSFETs MS1-MS7 from the type I 3-bit current source 1000. A type II 4-bit current source can be obtained by removing the PMOSFETs MS1-MS15 from the type I 4-bit current source 1100, and so on.

The following is the general recursive rule for a type II N-bit current source. When N is equal to one, the type II 1-bit current source includes two current branches coupled in parallel between the voltage terminal and the output terminal. The first current branch of the type II 1-bit current source is always turned on. The second current branch of the type II 1-bit current source is turned on or turned off according to the 1-bit input code. When N is greater than one, the type II N-bit current source includes two type II (N−1)-bit current sources and an expansion switch. The output current of each of the two type II (N−1)-bit current sources is controlled by the N−1 LSBs of the N-bit input code. The two type II (N−1)-bit current sources are coupled in parallel between the voltage terminal and the output terminal. The expansion switch is coupled in series with all the current branches of the second type II (N−1)-bit current source except the first current branch of the second type II (N−1)-bit current source between the voltage terminal and the output terminal. The first current branch of the second type II (N−1)-bit current source and the expansion switches are turned on or turned off according to the MSB of the N-bit input code.

Take the type II 4-bit current source obtained from removing PMOSFETs MS1-MS15 from the type I 4-bit current source 1100 as an example. The first type II 3-bit current source is the part of the type I 4-bit current source 1100 on the left side of the dashed line 1150 excluding the PMOSFETs MS1-MS3 and MS5-MS8. The second type II 3-bit current source is the part of the type I 4-bit current source 1100 on the right side of the dashed line 1150 excluding the switch 1102 and the PMOSFETs MS4 and MS9-MS15. The expansion switch is the switch 1102. The switch 1101 alone constitutes the first current branch of the second type II 3-bit current source.

Figure 12:
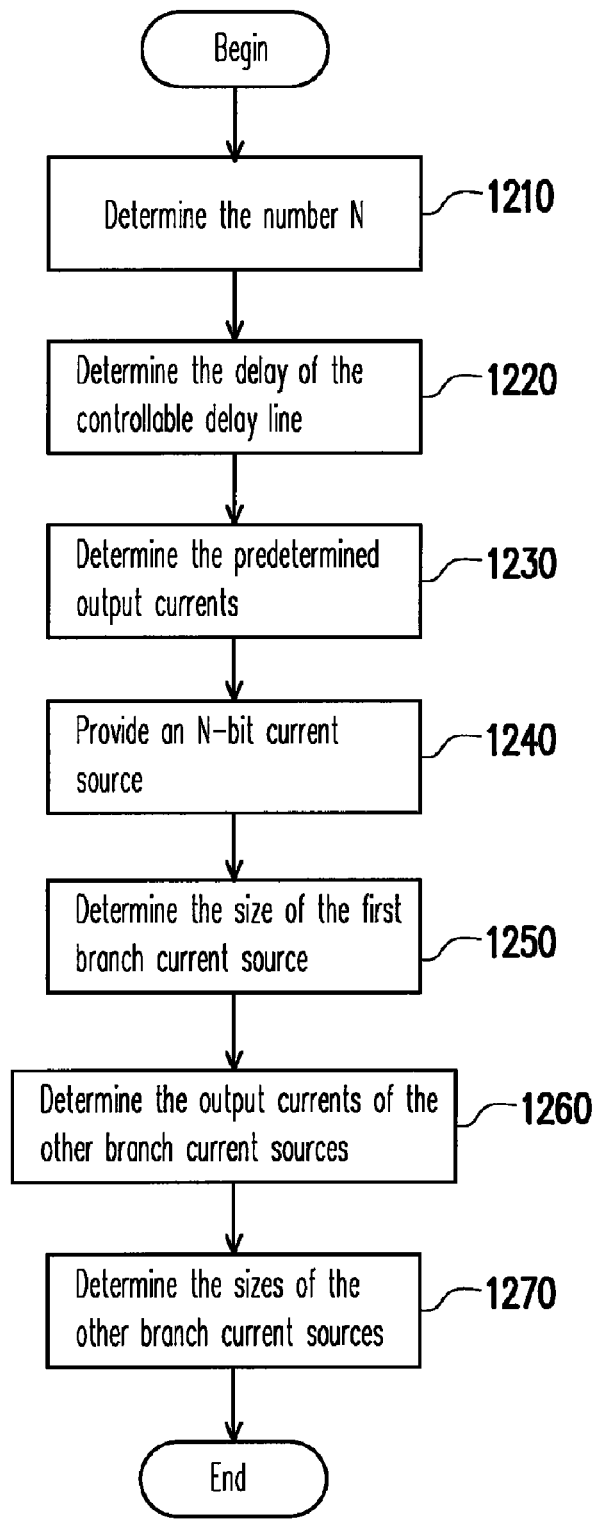
FIG. 12 is a flow chart of a method for designing a current source applicable to a current-starved controllable delay line according to an embodiment of the present invention.

The design of the N-bit current source alone is insufficient to achieve linear delay of the controllable delay line. The sizes of the branch current sources of the N-bit current source have to be determined. FIG. 12 is a flow chart of a method for designing an N-bit current source according to an embodiment of the present invention. The method can be used to determine the complexity of the N-bit current source and the sizes of the branch current sources of the N-bit current source.

Figure 13:
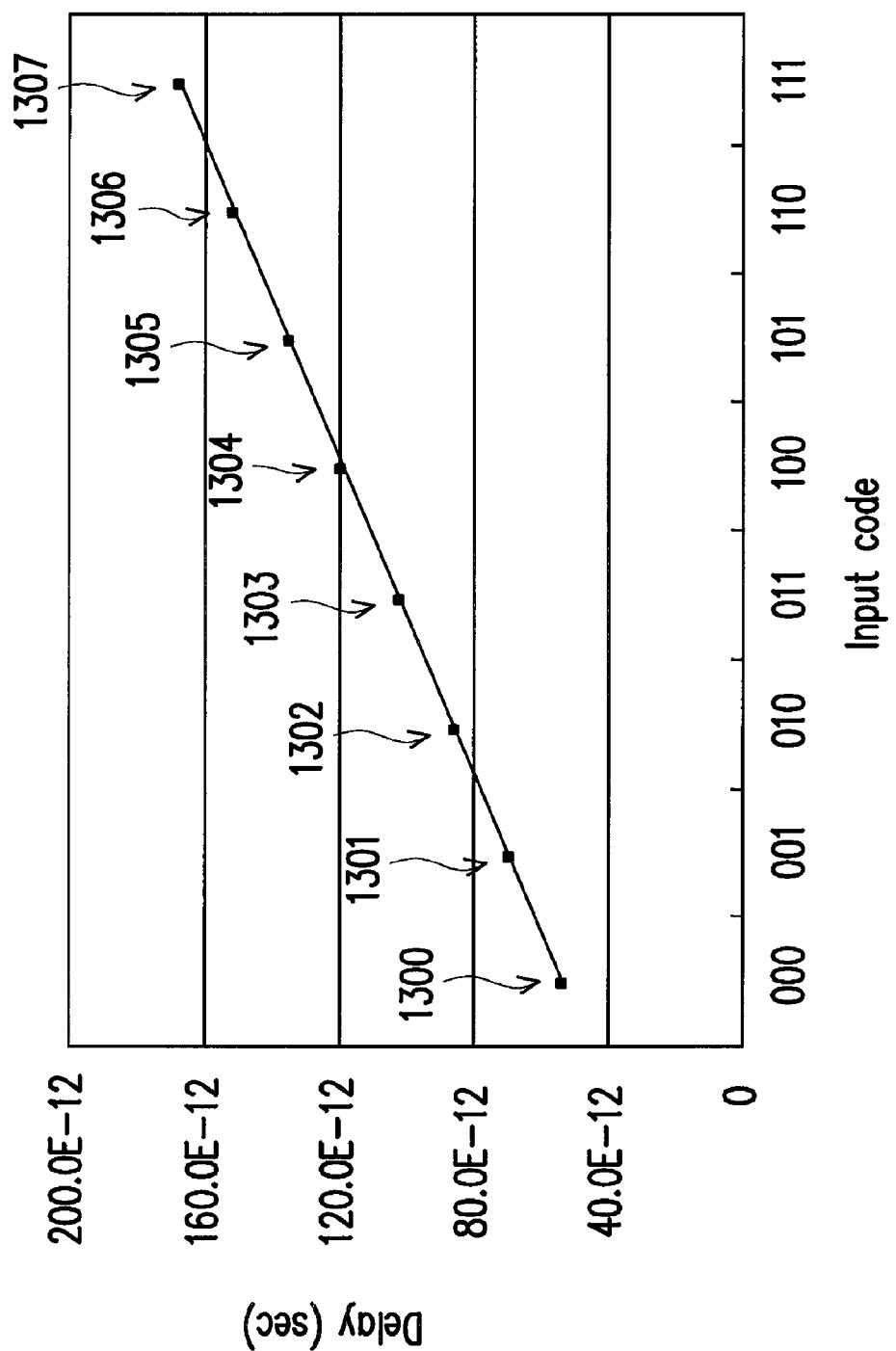
FIG. 13 is a schematic diagram showing the delay of a controllable delay line which adopts the current source in FIG. 10 according to an embodiment of the present invention.

Before executing the method, the designer determines a specification of the controllable delay line. This specification includes the delay range, the resolution, and the intrinsic delay of the controllable delay line. FIG. 13 shows the linear delay of a controllable delay line as an example. The intrinsic delay of the controllable delay line is shown as the minimum delay at the point 1300 in FIG. 13. The delay range is shown as the difference between the delay at the point 1300 and the delay at the point 1307. The first step (step 1210) of the method in FIG. 12 is determining the number N according to the delay range and the resolution of the controllable delay line. N represents the complexity of the N-bit current source. In this embodiment, N is the minimum positive integer that satisfies the following expression:

$$R >= D_{RANGE}/(2^N-1)$$

$D_{RANGE}$ is the delay range and R is the resolution. In this embodiment, N is 3 and the N-bit current source is the type I 3-bit current source 1000 shown in FIG. 10. The controllable delay line is the controllable delay line 600 in FIG. 6.

After determining N, the next step is determining the delay of the controllable delay line 600 corresponding to each of the values of the input code D0-D2 according to the delay range and the intrinsic delay of the controllable delay line 600 (step 1220). As shown in FIG. 13, the delay of the controllable delay line 600 corresponding to the values of the input code D0-D2 are shown as the points 1300-1307. The position of the point 1300 is predetermined by the intrinsic delay of the controllable delay line 600. The position of the point 1307 is predetermined by the intrinsic delay plus the delay range of the controllable delay line 600. Since the positions of the points 1300 and 1307 are already known and the delay of the controllable delay line 600 is required to be linear, the positions of the points 1301-1306 may be obtained by interpolation.

Next, determine each of the predetermined output currents of the 3-bit current source 1000 corresponding to each of the values of the input code D0-D2 so that the delay of the controllable delay line 600 conforms to the predetermined linearity in FIG. 13 (step 1230). The relationship between the delay and the predetermined output currents can be easily obtained because the structure of the controllable delay line 600 is well-known.

When N is determined in step 1210, the design of the N-bit current source is determined at the same moment (step 1240). Next, determine the size of the first branch current source (MS0) according to the predetermined output current corresponding to the value 7 of the input code D0-D2 (step 1250). FIG. 14 shows the on/off condition of the branch current sources MS0-MS7 corresponding to the values of the input code D0-D2. FIG. 10 and FIG. 14 show that only MS0 is turned on when the input code D0-D2 is equal to 7. Therefore the output current of MS0 is equal to the predetermined output current corresponding to the value 7 of the input code D0-D2. Once the output current of MS0 is determined, the size of MS0 may be obtained by software simulation or by techniques similar to those provided by the paper "A Digitally Programmable Delay Element: Design and Analysis" by Mohammad Maymandi-Nejad and Manoj Sachdev and published in IEEE Transactions on Very Large Scale Integration Systems, Vol. 11, No. 5, October 2003.

Next, for each value from 6 to 0 of the input code D0-D2, determine the output current of each of the branch current sources MS1-MS7 (step 1260). As shown in FIG. 14, when the input code D0-D2 is equal to 6, both MS0 and MS1 are turned on. The output current of MS1 may be determined by subtracting the output current of MS0 from the predetermined output current of the 3-bit current source 1000 corresponding to the value 6 of the input code D0-D2. When the input code D0-D2 is equal to 5, both MS0 and MS2 are turned on. The output current of MS2 may be determined by subtracting the output current of MS0 from the predetermined output current of the 3-bit current source 1000 corresponding to the value 5 of the input code D0-D2. When the input code D0-D2 is equal to 4, MS0 MS1, MS2, and MS4 are turned on. The output current of MS4 may be determined by subtracting the output currents of MS0, MS1, and MS2 from the predetermined output current of the 3-bit current source 1000 corresponding to the value 4 of the input code D0-D2. When the input code D0-D2 is equal to 3, both MS0 and MS3 are turned on. The output current of MS3 may be determined by subtracting the output current of MS0 from the predetermined output current of the 3-bit current source 1000 corresponding to the value 3 of the input code D0-D2. When the input code D0-D2 is equal to 2, MS0, MS1, MS3, and MS5 are turned on. The output current of MS5 may be determined by subtracting the output currents of MS0, MS1, and MS3 from the predetermined output current of the 3-bit current source 1000 corresponding to the value 2 of the input code D0-D2. The output currents of MS6 and MS7 may be determined similarly.

Next, determine the size of each of the branch current sources MS1-MS7 according to the output current of each of the branch current sources MS1-MS7 (step 1270). Since the output currents of MS1-MS7 are already determined, the sizes of MS1-MS7 may be determined in the same way as MS0.

The method depicted in FIG. 12, FIG. 13, and FIG. 14 can be easily extended for designing a general N-bit current source. The N-bit current source may be a type I or a type II current source.

Figure 4:
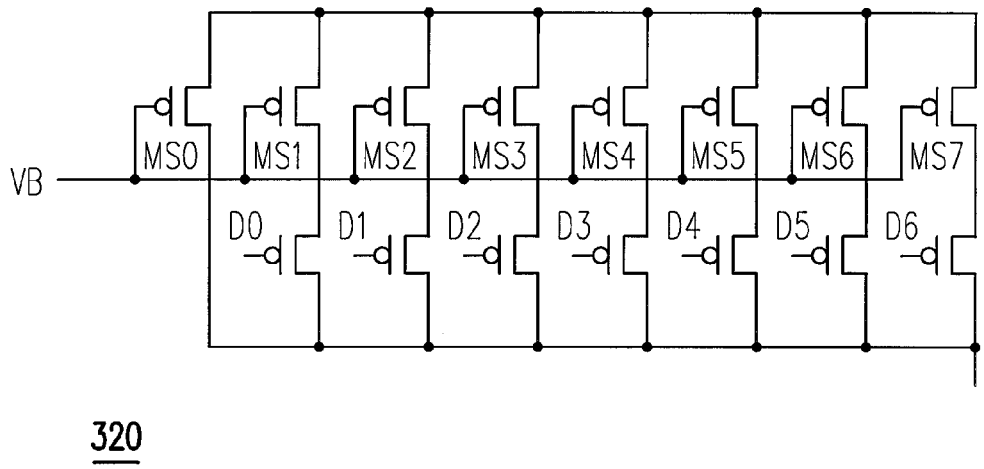
FIG. 4 is a schematic diagram showing the current source of the controllable delay line in FIG. 3.
Figure 5:
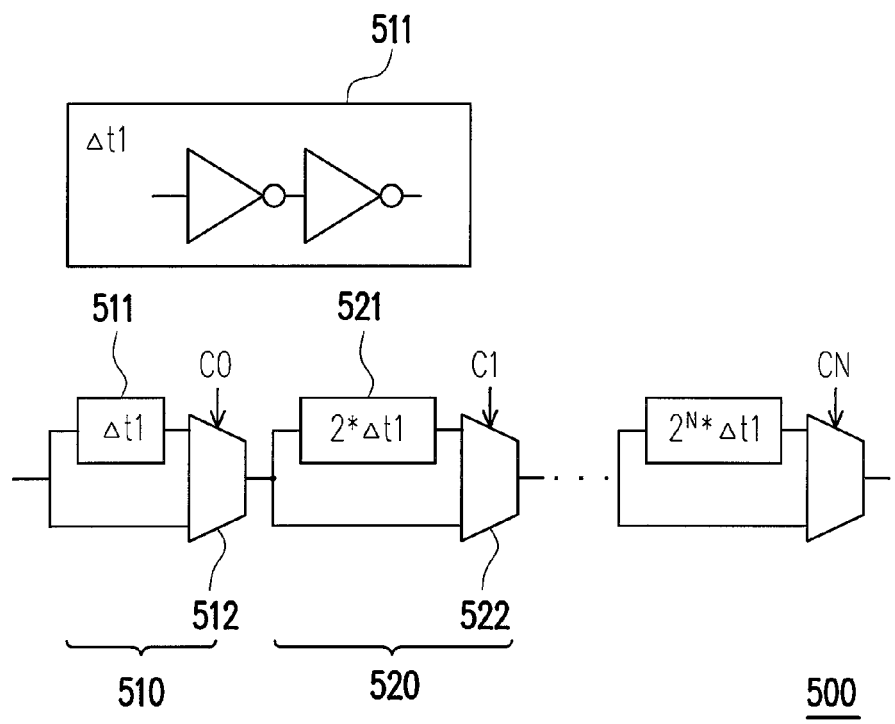
FIG. 5 is a schematic diagram showing a conventional programmable digital delay line.

The N-bit current source provided by the present invention enables a controllable delay line to provide linear delay. In addition, the N-bit current source provided by the present invention has a smaller area overhead than a conventional thermometer code current source does. Take the 3-bit current source 1000 in FIG. 10 as an example. FIG. 4 shows a conventional 3-bit thermometer code current source 320 excluding its binary-to-thermometer conversion circuit. Comparing FIG. 4 and FIG. 10 reveals that the 3-bit current source 1000 has three more transistors than the 3-bit thermometer code current source 320 does. However, FIG. 4 does not show the 3-bit binary-to-thermometer conversion circuit and the 3-bit binary-to-thermometer conversion circuit includes 84 transistors, which is an amount far greater than 3. In fact, for an arbitrary positive integer N, the transistor count of an N-bit current source provided by the present invention is always less than that of a conventional N-bit thermometer code current source.

Although FIG. 6 shows a current-starved controllable delay line, the N-bit current source provided by the present invention is applicable to other types of current driven controllable delay line as well. Furthermore, the N-bit current source provided by the present invention is also applicable to delay elements for jitter detection or time-interval detection, adjustable delay buffers, digital delay-locked loops, and phase-locked loops.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An N-bit current source whose output current is controlled by an N-bit input code, wherein N is a predetermined positive integer,
when N is equal to one, the N-bit current source comprises:
a first current branch; and
a second current branch coupled in parallel with the first current branch between a voltage terminal and an output terminal;
when N is greater than one, the N-bit current source comprises:
a first (N−1)-bit current source whose output current is controlled by the N−1 LSBs of the input code;
a second (N−1)-bit current source whose output current is controlled by the N−1 LSBs of the input code, wherein the first and the second (N−1)-bit current sources are coupled in parallel between the voltage terminal and the output terminal; and
a switch device coupled in series with each of the current branches of the second (N−1)-bit current source between the voltage terminal and the output terminal.

2. The N-bit current source of claim 1, wherein the first current branch of the N-bit current source is always turned on, the second current branch of the 1-bit current source is turned on or turned off according to the 1-bit input code, the switch device is turned on or turned off according to the MSB of the input code.

3. The N-bit current source of claim 2, wherein the switch device comprises:
a first expansion switch coupled in series with the first current branch of the second (N−1)-bit current source between the voltage terminal and the output terminal; and
a second expansion switch coupled in series with the other current branches of the second (N−1)-bit current source between the voltage terminal and the output terminal, wherein the first and the second expansion switches are turned on or turned off according to the MSB of the input code.

4. The N-bit current source of claim 1, wherein each of the current branches of the N-bit current source comprises a branch current source, output current of each of the branch current sources is determined by size of the corresponding branch current source, the output currents of the branch current sources of the turned-on current branches accumulate at the output terminal and the accumulated output currents are provided as the output current of the N-bit current source.

5. The N-bit current source of claim 4, wherein the output current of the N-bit current source is provided to a controllable delay line, the sizes of the branch current sources are predetermined so that the N-bit current source provides a predetermined output current in response to each value of the input code and, due to the predetermined output currents, delay of the controllable delay line exhibits a predetermined linearity with respect to the values of the input code.

6. The N-bit current source of claim 1, wherein the voltage terminal is coupled to a predetermined voltage.

7. An N-bit current source whose output current is controlled by an N-bit input code, wherein N is a predetermined positive integer,
when N is equal to one, the N-bit current source comprises:
a first current branch; and
a second current branch coupled in parallel with the first current branch between a voltage terminal and an output terminal;
when N is greater than one, the N-bit current source comprises:
a first (N−1)-bit current source whose output current is controlled by the N−1 LSBs of the input code;
a second (N−1)-bit current source whose output current is controlled by the N−1 LSBs of the input code, wherein the first and the second (N−1)-bit current sources are coupled in parallel between the voltage terminal and the output terminal; and
an expansion switch coupled in series with all the current branches of the second (N−1)-bit current source except the first current branch of the second (N−1)-bit current source between the voltage terminal and the output terminal.

8. The N-bit current source of claim 7, wherein the first current branch of the 1-bit current source is always turned on, the first current branch of the second (N−1)-bit current source and the expansion switches are turned on or turned off according to the MSB of the input code.

9. The N-bit current source of claim 7, wherein each of the current branches of the N-bit current source comprises at least one switch, the switch closest to the voltage terminal of each of the current branches serves as a branch current source of the corresponding current branch, output current of each of the branch current sources is determined by size of the corresponding branch current source, the output currents of the branch current sources of the turned-on current branches accumulate at the output terminal and the accumulated output currents are provided as the output current of the N-bit current source.

10. The N-bit current source of claim 9, wherein the output current of the N-bit current source is provided to a controllable delay line, the sizes of the branch current sources are predetermined so that the N-bit current source provides a predetermined output current in response to each value of the input code and, due to the predetermined output currents, delay of the controllable delay line exhibits a predetermined linearity with respect to the values of the input code.

11. The N-bit current source of claim 7, wherein the voltage terminal is coupled to a predetermined voltage.

* * * * *